United States Patent [19]

Ida et al.

[11] 4,426,251

[45] Jan. 17, 1984

[54] PORTABLE GOLD RECOVERY APPARATUS AND METHOD FOR USING SAME

[75] Inventors: Noble Ida; Paul E. Nelson; Peter N. Haugen, all of Boulder; Robert L. Aho, Longmont; Andrew A. Lucas, Fort Collins, all of Colo.

[73] Assignee: Storage Technology Corporation, Louisville, Colo.

[21] Appl. No.: 427,364

[22] Filed: Sep. 29, 1982

[51] Int. Cl.$^3$ .......................... C23F 1/02; B44C 1/22; C03C 15/00; C03C 25/06
[52] U.S. Cl. ................................ 156/656; 75/101 R; 156/642; 156/664; 156/345
[58] Field of Search ............... 156/642, 655, 664, 345, 156/656; 75/100, 101 R, 118 R; 134/10, 109–111

[56] References Cited

U.S. PATENT DOCUMENTS

4,261,738 4/1981 Valentine et al. .................... 75/103

Primary Examiner—William A. Powell
Attorney, Agent, or Firm—Bryant R. Gold

[57] ABSTRACT

A self-contained portable device for quickly and efficiently recovering a precious metal, such as gold, from bimetallically coated substrate material, such as printed circuit board connectors or tabs. The base metal to which the desired precious metal is bonded must be soluable in nitric acid and be partially exposed. The device includes a processing chamber into which the material to be processed is placed. An etching solution, having a prescribed composition that typically includes nitric acid and at least one effervescent compound, is used to dissolve away the base metal, causing a tunneling effect to free the desired precious metal. Selected agitation, coupled with the frothing action of the effervescent compound(s), greatly enhance the rate at which the precious metal is freed from the bimetallic material. Recirculation of the etching solution from a storage tank to the processing chamber, and vice versa, allows a relatively small amount of the etching solution to be used. At appropriate intervals, spent etching solution may be discharged from the storage tank and fresh solution introduced. A filter interposed in the recirculation channel catches and holds the desired precious metal, and provides a convenient collection point for removing the recovered precious metal from the device.

13 Claims, 8 Drawing Figures

PORTABLE GOLD RECOVERY APPARATUS AND METHOD FOR USING SAME

BACKGROUND OF THE INVENTION

This invention relates to an apparatus used in the recovery of precious metals from scrap materials, and more particularly to the recovery of gold, such as in the form of visible gold plate, from printed circuit board material and the like, and further wherein the gold is recovered in flake form without being dissolved.

Numerous devices have been proposed for handling, cleaning, rinsing, or otherwise processing scrap or other materials in order to recover or remove prescribed materials therefrom. The following U.S. patents are representative of the prior art known to the applicants in this area: U.S. Pat. Nos. 1,944,607; 3,106,217; 3,122,150; 3,320,963; 3,327,721; 3,565,587; 3,776,800; 3,871,914; 3,909,291; 3,990,462; 3,999,564; and 4,209,342. Each of these referenced patents discloses a particular type of device that inclues some sort of processing tank, chamber, or cage wherein the material to be processed may be placed and exposed to a processing solution of some type of variety. Most of these devices further include provisions for shaking, vibrating, or otherwise agitating the material once it has been placed within the device. None of these disclosures, however, taken alone or in combination, show or suggest a compact, self-contained unit for efficiently recovering a precious metal, such as gold, from scrap material.

An additional patent known to applicants, U.S. Pat. No. 4,261,738, describes a process for recovering a precious metal, such as gold, from a bimetalic material. Unfortunately, the apparatus required to carry out the process disclosed in this patent is of the type which is only found in large, complex processing facilities. Moreover, the method itself is cumbersome and expensive to effectuate. It is apparent, therefore, that a need exists for a simple, easy-to-operate device that can be used to efficiently recover a prescribed precious metal from scrap or other material. Especially, with the present market value of gold, and with the relatively large amounts of printed circuit board scrap material in existance from which gold plating could be recovered, there is a definite need for an easy-to-operate, efficient, inexpensive method and apparatus directed to the recovery of such gold.

There is disclosed in a copending patent application assigned to the same assignee as is this application, Ser. No. 427,365, filed Sept. 29, 1982, Attorney Docket No. R/T-81-7, entitled "Gold Recovery Method", an improved method for recovering a precious metal, such as gold, from printed circuit board scrap material and the like. This "Gold Recovery Method" application is hereby incorporated by reference in this application. The present invention, in an attempt to fufill the identified need in the art, is directed towards an apparatus that efficiently incorporates the recovery method disclosed in the above referenced copending application.

SUMMARY OF THE INVENTION

It is an object of the present invention to provide an apparatus for the recovery of a precious metal, such as gold, from printed circuit board scrap material and the like that is easy and inexpensive to operate.

It is a further object of the present invention to provide such a gold recovery apparatus that is self-contained and portable, thereby allowing it to be readily taken to and operated at any desired location where the scrap or other material is available.

It is another object of the present invention to provide such a gold recovery apparatus that uses a recovery method wherein the recovered gold is not dissolved in the processing solution, whereby the gold recovered through the operation of said apparatus does not need to be further refined.

It is still a further object of the present invention to provide such a gold recovery apparatus wherein the processing method may be carried out under manual or automatic control, as selected by the operator.

It is still another object of the present invention to provide a self-contained gold recovery apparatus that recovers gold from scrap material, such as printed circuit board connectors and tabs, that is of a very high grade and that does not have to be further refined in order to improve the purity thereof.

The above and other objects of the invention are realized in a compact, self-contained, portable unit that includes a processing chamber into which the scrap material may be placed. A recovery solution, conveniently stored in a storage tank that is housed within the unit, is then transferred into the processing chamber and allowed to come in contact with the scrap material. The scrap material advantageously includes a partially visible base metal to which the precious metal to be recovered is physically or otherwise bonded. The base metal is soluable in the recovery solution, while the precious metal to be recovered is not. Thus, as the scrap material is exposed to the recovery solution, the base metal dissolves, allowing the precious metal to break away in flakes from the scrap material. These flakes are recovered in a detachable filter device as the recovery solution is drained from the processing chamber and as the chamber (and the materials therein) are subsequently rinsed with a suitable rinsing solution, such as water. The recovered flakes of the precious metal may then be directly removed from the detachable filter.

Advantageously, the above process may be carried out under automatic control, is desired, provided through appropriate electronic control circuitry such as a microprocessor circuit or timing circuits.

The recovery solution may be recirculated within the unit through the use of an internal pump and appropriate valves, thereby allowing the recovery solution to be used over and over again until it becomes saturated with the dissolved base metal. Once saturated, the recovery solution can be expelled from the storage tank and a fresh recovery solution may be introduced therein. Agitation means may also be included, as needed, in order to increase the exposure rate of the base metal to the recovery solution during the recovery cycle.

As above summarized, a compact self-contained recovery unit is disclosed that may be easily rendered portable. To make the device portable, all that is required is: (1) a source of electrical power, such as a 110 volt line voltage; (2) a source of rinse fluid, such as water; and (3) a drain to which the rinse fluid may be expelled. In addition, appropriate hook-ups may be provided for filling and draining the storage tank with the recovery solution as required.

Operation of the unit is a simple three step process: (1) placing the scrap material in the processing chamber within the unit; (2) initiating the recovery cycle by, for example, pushing a "start button" or activating a switch; and (3) recovering the precious metal flakes from a detachable filter once the recovery cycle, including rinsing, is complete. The operation of the unit is thus comparable to the operation of, for example, an automatic washing machine.

BRIEF DESCRIPTION OF THE DRAWINGS

The above and other objects, features, and advantages of the present invention will be more apparent from the following more particular description of the invention, presented in connection with the following drawings, in which.

DETAILED DESCRIPTION OF THE INVENTION

The present invention will be best understood by reference to the accompanying drawings, wherein like numerals or other designations are used to refer to like parts throughout.

Figure 1:
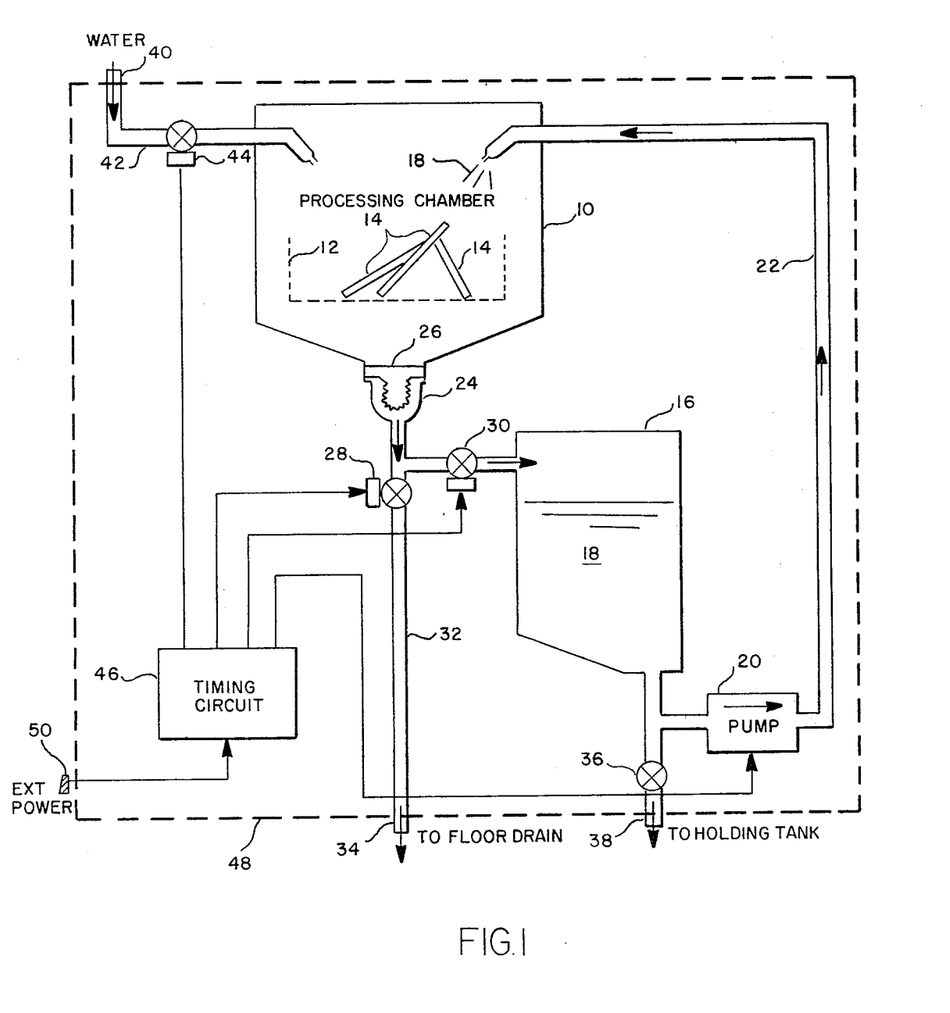
FIG. 1 shows a simplified embodiment of the apparatus of the present invention in diagrammatic form.

Referring first to FIG. 1, there is shown a diagrammatic view of a compact, simplified, embodiment of the present invention. A processing chamber 10 includes a basket 12, or other suitable holding device, into which printed circuit board scrap material 14 may be placed. A storage tank 16 has a supply of recovery solution 18 stored therein. A pump 20 delivers the recovery solution 18 into the processing chamber 10 by means of a conduit or pipe 22.

Disposed at the bottom of the processing chamber 10 is a filter pouch 24 into which a filter 26 may be inserted. This filter 26 may be a "sock" type filter made from a fine mesh material. This fine mesh material allows a solution to readily pass therethrough, but catches any flakes or solid particles and collects them therein. Other types of filters could also be used.

Two valves, 28 and 30, are connected to the output of the filter pouch 24 as shown. When valve 30 is open and valve 28 is closed, any solution in the processing chamber 10 will drain through the filter 26 into the top of the storage tank 16. Similarly, when valve 30 is closed and valve 28 is opened, the solution within the processing chamber 10 will drain through the filter 26 and the pipe 32 to a floor drain output 34.

A valve 36, connected to the output of the storage tank 16, allows the solution within the storage tank to be drained to a holding tank connection 38.

An external connection 40 provides a means to which an external source of rinsing fluid, such as water, may be connected and directed to the processing chamber 10 via pipe 42. A separate valve 44 may advantageously be inserted in the line 42 so as to selectively control when the rinsing fluid is alllowed to flow into the processing chamber 10.

In the compact embodiment shown in FIG. 1, the valves 28, 30, and 44 may be of the solenoid type which can be activated with an electrical signal. A suitable timing circuit 46 could therefore be used in order to energize (maintain in the open position) these solenoid valves for the appropriate period of time. Moreover, the timing circuit 46 provides the appropriate interelationship between the opening and closing of these valves so that only the desired valves are open at the desired time.

For the simplified embodiment of FIG. 1 it is contemplated that the valve 36 could be realized with a manual valve; although it too could be realized with a solenoid-type valve if desired. Likewise, the valves 28, 30, and 34 could all be realized using manual valves if desired. If all manual valves were employed, only a switch to the pump would be required. However, such a manual operation would have to be carefully monitored to ensure that only the proper valves were closed and opened at the appropriate time.

It is contemplated that all of the components shown in FIG. 1 could be housed within a compact structure, such as is symbolically illustrated in FIG. 1 by the dotted line 48. A suitable electrical plug or connector 50 would thus be employed to supply the timing circuit 46 with the needed electrical power. The timing circuit would, in turn, provide the needed power to operate the valves and pump.

Figure 6A:
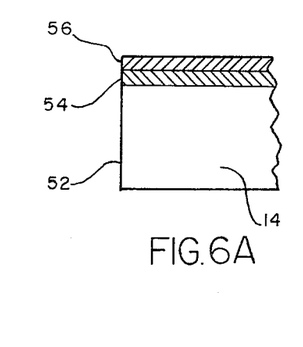
FIGS. 6a and 6b are simplified cross sectional views of a bimetalic material, such as a printed circuit board, of a type contemplated for use with the present invention.
Figure 6B:
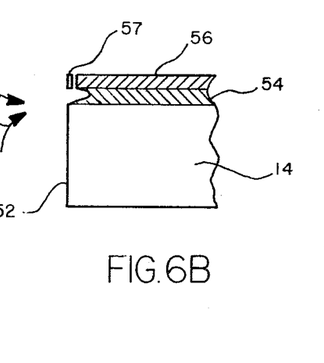

Referring next to FIGS. 6a and 6b, there is shown cross sectional views of the printed circuit board scrap material of the type contemplated for use with the present invention. FIG. 6a depicts the material prior to being exposed to the recovery solution 18. A substrate material 52, typically non-metalic and non-conductive, such as an epoxy glass material, has a base metal 54 deposited thereon. For printed circuit board connectors and tabs, this base metal 54 is typically copper, brass, or bronze. A layer of gold 56, or other precious metal, is then mechanically bonded to the base metal 54. It is the gold 56 that is recovered by use of the apparatus of the present invention.

As indicated in FIG. 6a, at least a portion of the base metal 54 is visible—that is, exposed externally—as the printed circuit board material is inserted into the processing chamber 10. As the recovery solution 18 comes in contact with the base metal 54, the base metal 54 is dissolved therein, thus causing a tunneling effect between the substrate 52 and the precious metal 56, as illustrated in FIG. 6b. As the base metal 54 is tunneled away from underneath the precious metal 56, a piece or flake 57 of the precious metal 56 will break away from the scrap material. These flakes or pieces of metal 57 may then be captured in the filter 26.

As disclosed in the previously referenced copending application Ser. No. 4,273,365, filed Sept. 29, 1982, the recovery solution 18 may have one or more effervescent compounds or froth producing compounds incorporated therein. These effervescent compounds help overcome the generally high surface tension that may exist between the gold flakes and the substrate material 52, thereby allowing the flakes to break free from the substrate so that they can be recovered in the filter 26.

Returning again to FIG. 1, the operation of the present invention can now be explained. The scrap material having the gold or other precious metal plated thereon, is placed in the basket 12 of the processing chamber 10. In one mode of operation, pump 20 is turned on, valve 30 is opened, valve 28 is closed, and the recovery solution 18 is constantly sprayed and re-circulated through the chamber 10. In an alternative mode of operation, both valves 28 and 30 are maintained in their closed position, thereby allowing the processing chamber 10 to become filled with the recovery solution 18. Once the chamber 10 is full, the pump 20 is turned off. Whichever mode of operation is employed, the scrap material 14 is allowed to come in contact with the recovery solution 18. This contact causes the tunneling effect previously described to commence. During this time, it may be advantageous to vibrate or otherwise agitate the basket 12 in order to change the orientation of the scrap material 14 to ensure that the recovery solution 18 comes in contact with the base metal 54.

After a sufficient length of exposure to one of the above modes of operation, all of the gold flakes 57 suspended in the solution 18 are caught in the filter 26. A rinse operation may also be employed. During this rinse operation, additional flakes of gold 57, (or other precious metal) are washed from the material 14, the basket 12, or the inside walls of the chamber 10, into the filter 26. When the rinse cycle is complete, the processing chamber may be opened and the filter sock 26 removed. The precious metal flakes may then be recovered directly from the filter 26.

Figure 2:
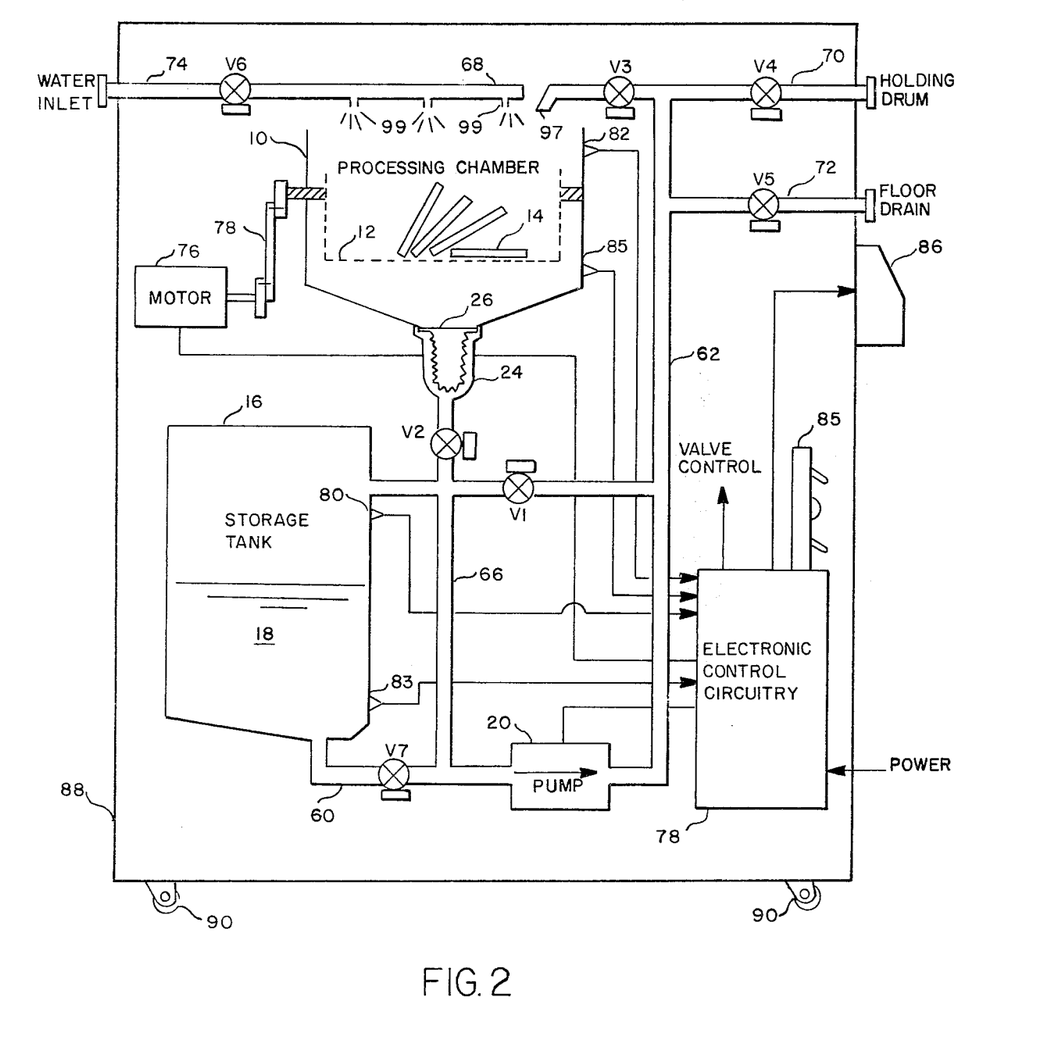
FIG. 2 is a diagrammatic view of a second embodiment of the apparatus of the present invention.

Referring next to FIG. 2, there is shown an alternative, embodiment of the present invention. As with the simplified, more compact embodiment in FIG. 1, the embodiment of FIG. 2 likewise includes a processing chamber 10 having a basket 12 mounted therein. Printed circuit boards, or other scrap material, 14 may be placed within the basket 12. A storage tank 16 is adapted to hold a supply of recovery solution 18. Pipes or conduits 60–74 provide the necessary "plumbing" internal to the unit in order to allow the recovery solution 18, or other desired fluid, to be routed to the appropriate locations. Valves V1–V7 are placed within the lines as shown in order to selectively define a desired path for the fluid depending upon the particular operating cycle of the unit.

Figure 5:
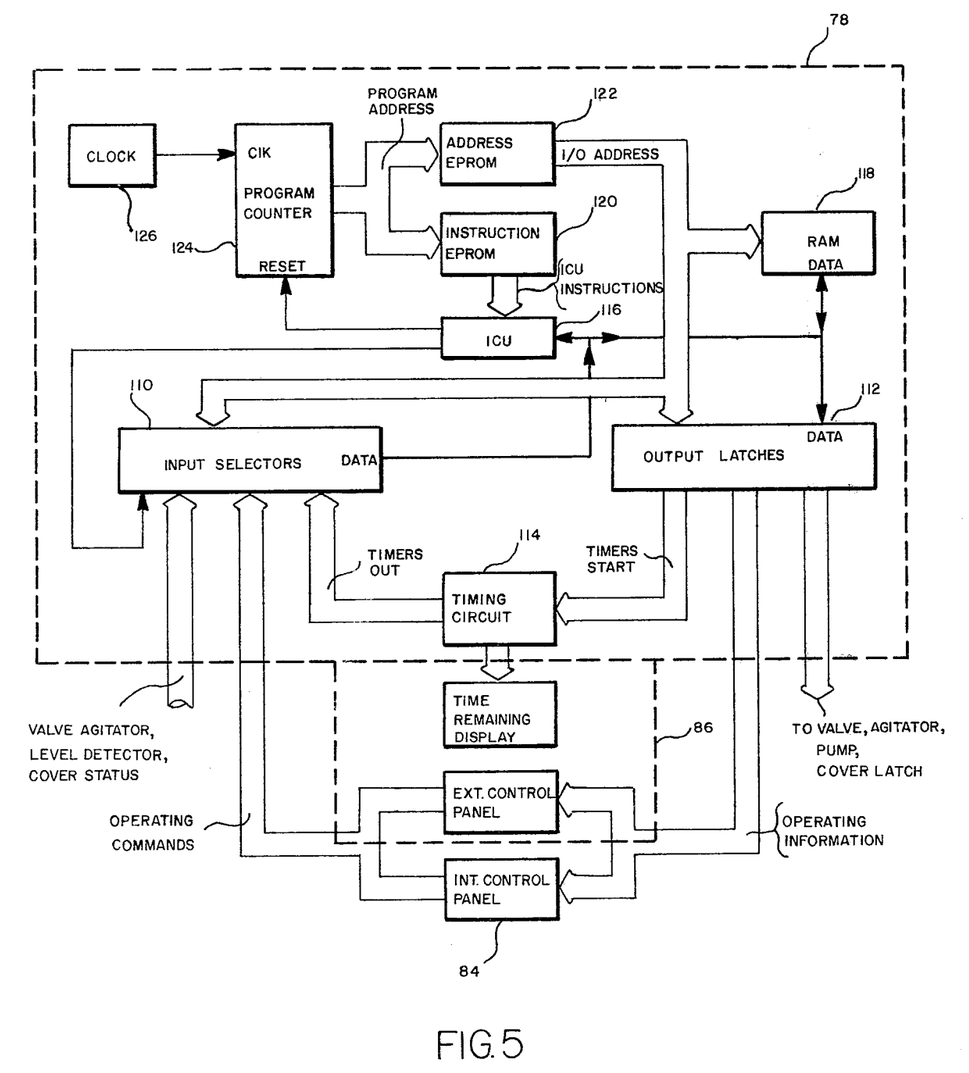
FIG. 5 is a block diagram of the electronic control circuitry used with the apparatus of FIG. 2.

A motor 76 provides a reciprocating force through a connecting arm 78 that rocks the holding basket 12 back and forth within the processing chamber 10. Electronic control circuitry 78, further described in connection with FIG. 5, provides the necessary control signals to operate the valves V1–V7, as well as the motor 76 and the pump 20. Further, level sensors 80 and 82 signal the control circuitry 78 as to when the storage tank 16 or the processing chamber 10, respectively, are full. Similarly, level sensors 83 and 85 signal when these tanks or chambers are empty. Cover switches, not shown, may also be used to sense when the cover or lid 94 is in its closed position. The electronic control circuitry 78 may advantageously include a control panel 84 that allows a thorough diagnostic check of the entire gold recovery unit, including the electronic control circuitry 78. An operator's panel 86 is also coupled to the control circuitry 78. The operator's panel 86 allows an operator to initiate an appropriate cycle. The panel 86 further indicates the status of the unit as it is operating. In contrast, the control panel 84 is not designed to be accessable to a typical user of the unit. Rather, it is accessable only to trained personnel and would be used in performing detailed diagnostic and trouble shooting of the unit.

All of the elements shown in FIG. 2 are housed in a compact frame 88 which advantageously includes wheels 90 in order to allow the entire unit to be easily transported from one location to another.

Figure 4:
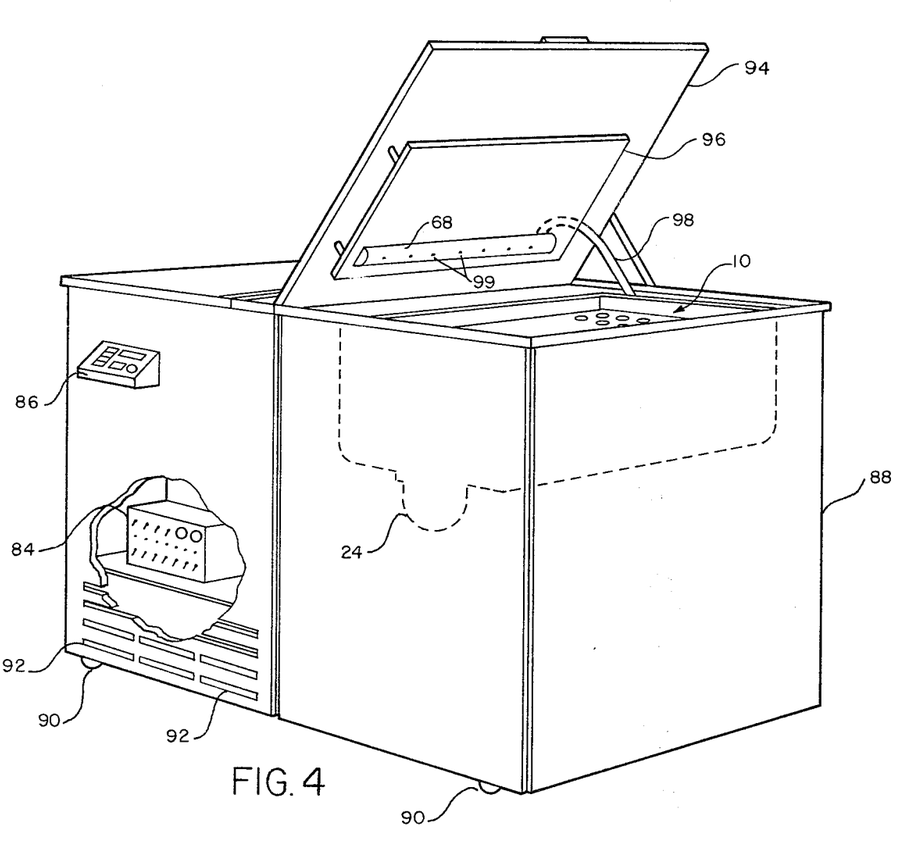
FIG. 4 is a perspective view of a representative realization of the present invention.

A perspective view of the apparatus comprising the elements of FIG. 2 is shown in FIG. 4. As shown in FIG. 4, the entire unit may be housed in a suitable portable cabinet 88. A portion of one of the walls of the cabinet is shown broken away in FIG. 4 in order to reveal the internal control panel 84. Vent holes or slots 92 permit adequate air circulation to cool the electronic control circuitry 78.

As indicated in FIG. 4, an upper door 94 of the cabinet may be swung open in order to gain access to the processing chamber 10. The pipe 68, shown diagrammatically in FIG. 2 as being above the processing chamber 10, may be realized by attaching a suitable piece of pipe to a lid 96 that fits over the processing chamber 10. A piece of flexible tubing 98 may then couple other tubes to the pipe 68 in order to allow the appropriate rinse solution to flow therethrough and into the top of the processing chamber 10 through nozzle openings 99. The recovery solution 18 is delivered to the processing chamber 10 via the open pipe 97.

In the perferred embodiment, the basket 12 may be detached from the processing chamber 10 and removed from the unit in order to facilitate loading and unloading of the scrap material. Further, removal of the basket 12 simplifies access to the filter pouch 26, which pouch is removed after the operating cycle is complete in order to recover the gold or other precious metal therefrom.

The storage tank 16 may be conveniently located directly underneath the processing chamber 10 in the front portion of the unit shown in FIG. 4. (The "front portion" is that portion showing the lid 94 raised therefrom.) The rear portion of the unit may then be used to house the electronic control circuitry 78 and the required "plumbing".

Figure 3:
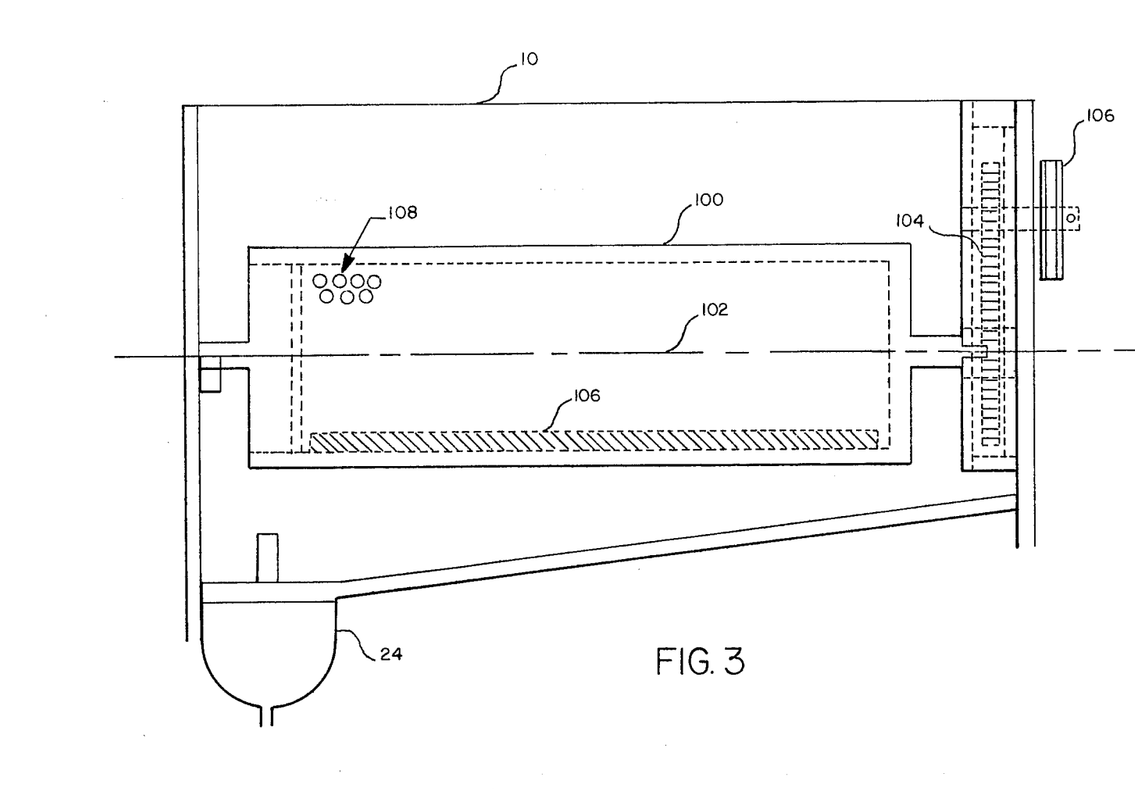
FIG. 3 shows an alternative embodiment of the agitatiion method that may be used with the present invention.

FIG. 3 depicts an alternative embodiment that could be used with the invention in connection with the processing chamber 10. In this embodiment, a cylindrical drum 100 is rotatably mounted within the processing chamber 10 so that it may rotate about its longitudinal axis 102. A drive mechanism 104, realized with suitable belts or gears, couples the rotation of the drum 100 to a pully 106, which pully 106 may be likewise coupled to a motor, such as the motor 76 shown in FIG. 2. The printed circuit board scrap materials 14 are adapted to be inserted inside the drum 100. Four ribs, spaced approximately 90 degrees apart, are placed inside of the drum to ensure that the printed circuit board scrap materials are thoroughly turned and mixed as the processing chamber 10 is filled with the recovery solution 18. The drum 100 has holes 108 placed around the exterior wall thereof in order to allow the recovery solution 18 to freely flow in and around the scrap materials.

Referring next to FIG. 5, there is shown a simplified block diagram of the electronic control circuitry 78 that is used with the embodiment of the invention shown in FIG. 2. In this embodiment, the circuitry provides a customized microprocessor-type circuit that includes input selectors 110 and output latches 112. The input selectors 110 receive status information (e.g., the status of valves V1–V7, motor 76, level detectors 80, 82, 83, 85, and cover switch) from throughout the machine, operating commands from the control panels, and timer information from a timing circuit 114. The input selectors 110 provide data to the industrial control unit (ICU) 116. A random access memory (RAM) 118 is used as a placemarker and also communicates with the ICU 116. Output latches 112 receive instructions from the ICU 116 and provide operating information to the control panels; enabling signals to the valves V1–V7, pump 20, motor 76, and cover latch; and timer starting signals to the timing circuit 114. ICU instructions are provided from an Instruction EPROM 120 (erasable programable read only memory), while I/O (Input-/Output) addresses are provided to the input selectors 110, output selectors 112, and RAM 118 from an Address EPROM 122. In turn, the program addresses of the Address EPROM 122 and the Instruction EPROM 120 are provided by a Program Counter 124 that is clocked from a clock source 126.

By using the circuit configuration shown in FIG. 5, the operation of the gold recovery apparatus may be precisely controlled in a programmable fashion. Thus, modifications may be readily made to the operating cycle as needed.

Those skilled in the art may realize the circuitry shown in FIG. 5 by using commericaly available electronic components. Care should be exercised, however, to coat or otherwise protect these components, including any circuit boards to which the components are attached, from the acid-type environment to which the components are likely to be exposed. A suitable silicone coating may be used for this purpose.

Figure 7:
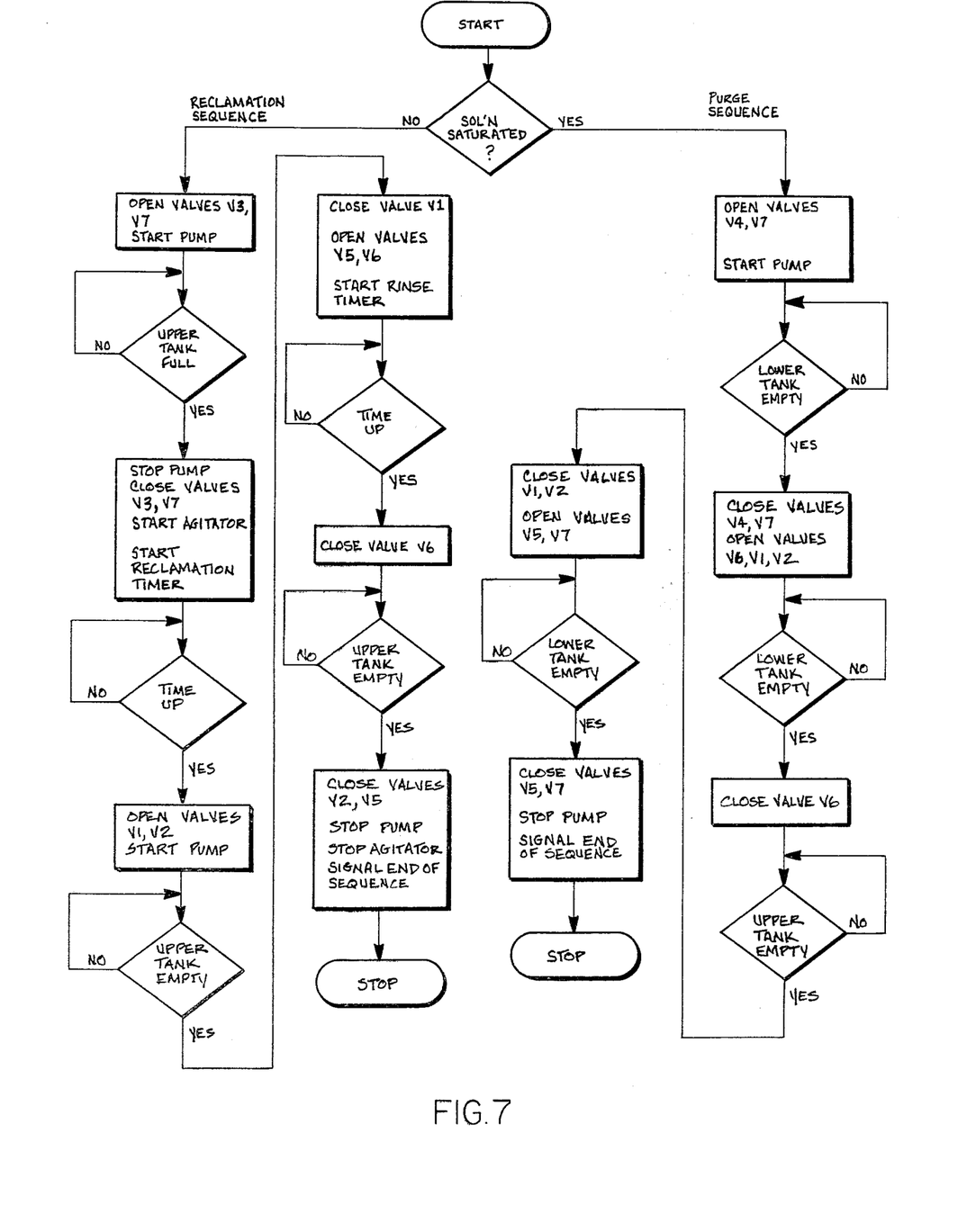
FIG. 7 is a flow chart depicting representative operating cycles of the apparatus of FIG. 2.

The operation of the embodiment of the invention shown in FIG. 2 may now be explained in connection with the flow chart of FIG. 7. There are essentially two modes of operation associated with the unit: (1) a reclamation sequence, during which the gold flakes are recovered from the printed circuit board scrap material; and (2) a purge sequence, during which the recovery solution 18 is purged from the system into a holding drum so that a new, fresh, recovery solution 18 may be used with the unit.

During the reclamation sequence, after the scrap materials 14 have been placed within the basket 12, valves V3 and V7 are opened and the pump is turned on. This moves the recovery solution 18 from the tank 16 into the processing chamber 10. All other valves remain closed. As soon as the processing chamber 10 is full, as sensed by the level sensor 82, the pump is stopped and valves V3 and V7 are closed. The motor 76 is then started in order to begin agitaion, and a reclamation timer is initiated.

After a prescribed period of time, typically on the order of two to four hours, valves V1 and V2 are opened and the pump 20 is started in order to transfer the recovery solution 18 back to the storage tank 16. Once this transfer is complete, valve V1 is closed and valves V5 and V6 are opened so that rinse water may begin to flow into the chamber 10. This rinse water is pumped from the chamber 10, through lines 66 and 62 to the floor drain connection 72. The rinsing operation continues for a set period of time.

At the conclusion of the rinse cycle, valve V6 is closed and valve V5 remains open, along with valve V2, until such time as the processing chamber is empty of all the rinsing water. At this time valves V2 and V5 are closed and the pump and motor are stopped and the end of the reclamation cycle is signaled. The operator may then open the lid 94, remove the basket 10, and remove the detachable filter sock 26 which contains the recovered gold flakes.

A purge sequence is initiated by opening vlaves V4 and V7 and starting the pump 20. It is assumed, of course, that an appropriate connection is made between the holding drum output 70 and a suitable drum wherein the recovery solution 18 may be stored until it can be disposed of. This recovery solution 18 typically includes at least 50% by weight of nitric acid ($HNO_3$), as discussed in the copending patent application. Thus, it cannot be disposed of without exercising some care.

Once all of the recovery solution 18 has been pumped from the storage tanks 16, valves V4 and V7 are closed and valves V6, V1, and V2 are opened and the pump is left running. This in effect allows the storage tank 16 to be flushed with the rinsing water obtained at the water inlet 74. Once the storage tank is full with this water rinsing solution, valve V6 is closed and the remaining water, if any, is pumped from the processing chamber 10. Valves V1 and V2 are then closed, and valves V5 and V7 are opened, thereby pumping the water from the storage tank 16 to the floor drain connection 72. Once the storage tank 16 is empty, valves V5 and V7 are closed and the pump is stopped. An appropriate end of sequence signal is then given, indicating that the purged sequence has been completed. A new fresh recovery solution may then be placed in the storage tank 18 by, for example, pouring the solution directly into the processing chamber 10, opening valves V1 and V2, and starting the pump 20. Alternatively, a suitable inlet (not shown in the Figures) may be provided to allow the recovery solution to be poured directly into the storage tank 18.

The purged sequence as above-described need only to be performed when the recovery solution 18 is saturated with the base metal 54. Depending upon the size of batches which are run, this purge sequence will typically only have to be performed after approximately six (6) reclamation sequences have been completed.

Because of the acidic solutions that are used with the present invention, some care must be exercised with respect to the materials that are used and exposed to such solutions. Furthermore, the electronic control circuitry 78, or the timing circuitry 46, should be adequately protected for the environment in which it will be used. Typically, such protection can be realized by merely coating any electronic circuit boards with a suitable plastic coating so as to seal them from any acid spills, or other exposures, that might occur.

The "plumbing" (i.e., pipes or lines 60–74 of FIG. 2) may be realized using PVC or CPVC pipes, which pipes are commercially available. The storage tank 16 may be made from polypropylene, as may the basket 12 and processing chamber 10. The filter "sock" may be realized from a stainless steel mesh material. Alternatively, a polypropylene type of mesh material could be used. The solenoid controlled valves should be valves which are normally closed. Such valves may be procurred commercially from numerous vendors. The valves used in the embodiment reduced to practice by the present inventors were procurred from a company named Plast-O-Matic.

To date, the purity of the gold recovered from using the above-described apparatus has been greater than 99.5%. Such purity precludes having to refine the gold before it can be sold or reused for other purposes. Thus, the invention provides a very useful device for recovering pure gold from scrap material.

While the invention herein disclosed has been described by means of specific embodiments and applications thereof, it is to be understood that numerous variations and modifications could be made thereto by those skilled in the art without departing from the spirit and scope of the present invention. It is therefore to be understood that within the scope of the appended claims, the invention may be practiced otherwise than as specifically described herein.

What is claimed is:

1. A self-contained gold recovery unit for recovering gold from printed circuit board tabs in which the gold is bonded to a partially visible metallic underplating, said underplating being bonded to a nonmetallic substrate, said unit comprising:
   a processing chamber into which the printed circuit board tabs may be placed,
   a tank for holding an etching solution adapted to dissolve said metallic means for introducing a froth producing agent into said etching solution held in said holding tank, said froth producing agent being adapted to create a vigorous frothing action whenever said etching solution comes in contact with said metallic underplating;
   first means for selectively delivering and removing the etching solution to and from the processing chamber, whereby the metallic underplating is dissolved, allowing said gold, with the aid of said frothing action, to flake away;
   second means for selectively delivering and removing a rinsing fluid to and from the processing chamber, whereby the gold flakes are flushed away from said substrate and processing chamber; and
   collection means for collecting said gold after it has flaked away from said underplating and been flushed away from said substrate and processing chamber.

2. The gold recovery unit as defined in claim 1 wherein said first delivery and removal means comprises:
   a first conduit connecting an outlet of said tank to an inlet of said processing chamber;
   a second conduit connecting an outlet of said processing chamber to an inlet of said tank;
   pump means for selectively circulating said etching solution from said tank to said chamber through said first conduit, and from said chamber to said tank through said second conduit; and
   valve means for selectively opening and closing said first and second conduits.

3. The unit as defined in claim 2 wherein said collection means comprises a filter interposed between the outlet of the processing chamber and said second conduit, said filter being adapted to allow the etching solution to pass therethrough but not the gold flakes.

4. The unit as defined in claim 3 wherein said filter comprises a sock made from a stainless steel mesh material.

5. The unit as defined in claim 3 further including agitation means for selectively agitating the printed circuit board tabs that are placed in the processing chamber, whereby the exposure of said partially visible metallic underplating to said etching solution is increased.

6. The unit as defined in claim 5 wherein said processing chamber, tank, delivery and removal means, and collection means are housed in a portable compact structure.

7. The gold recovery unit of claim 4 wherein said first and second means are automatically controlled by an electronic control unit housed within said portable structure, said control unit comprising:
   a control panel for allowing an operator to select a desired mode of operation and for generating corresponding control signals;
   timing means for generating timing and address signals;
   input selectors for generating additional control signals in response to status information received from throughout said gold recovery unit, including from said timing means and said control panel;
   sequencing means for generating output command signals in response to said control and address signals received from said timing means, control panel, and input selectors; and
   output latches, responsive to said command signals, for generating enabling signals that are delivered throughout said gold recovery unit to effectuate the desired operation of said gold recovery unit.

8. The gold recovery unit of claim 7 wherein said timing means comprises:
   a clock circuit for generating said address signals in response to a clock signal generated within said clock circuit; and
   a timing circuit for generating a plurality of timed control signals in response to select command signals received from said output latches.

9. A self-contained device for recovering a precious metal from a bimetallic material in which said precious metal is bonded to a partially visible base metal that is soluable in nitric acid, and wherein said base metal is bonded to a nonmetallic substrate, said device comprising:
   a frame having wheels attached thereto, whereby said frame may be portably moved to a desired location;
   a storage tank attached to said frame, including means for introducing an acid etching solution and a froth producing agent therein;
   a closable processing chamber also attached to said frame for holding a bath of the bimetallically coated substrate material from which precious metal is to be recovered;
   delivery means for delivering a selected fluid to and from the processing chamber;
   control means for selectively causing the delivered fluid to firstly be the solution stored in said storage tank, followed secondly by a rinsing fluid that is coupled to said delivery means from a rinsing fluid source; and
   filter means interposed in said delivery means for removing and collecting solid particles found in said delivered fluids;
   whereby said acid etching solution and froth producing agent may firstly come in contact with said base metal and dissolve the same, thereby tunneling under said precious metal and allowing it to brake away in flakes from said substrate, and whereby said froth producing agent creates a frothing action that increases the rate at which the precious metal flakes away from said substrate, and further whereby said rinsing fluid may secondly flush said processing chamber and wash all of the precious metal flakes towards said filter means, which flakes are subsequently collected in said filter means.

10. The device of claim 9 wherein said closable processing chamber includes agitation means for selectively agitating said bimetallically coated substrate material placed therein, thereby increasing the rate at which the visible portions of the soluable base metal are exposed to said etching solution.

11. The device of claim 10 wherein said agitation means comprises a basket pivotally mounted within said closable chamber, said basket being selectively coupled to a reciprocating force that causes the basket to assume a rocking motion, said basket being adapted to hold the batch of bimetallically coated substrate material being processed.

12. The device of claim 10 wherein said agitation means comprises a cylindrical drum pivotally mounted at its ends within said closable chamber, said drum being selectively coupled to a rotating force that causes the drum to turn about a longitudinal axis, said drum being adapted to hold the batch of bimetallically coated substrate material being processed.

13. A method of recovering gold from printed circuit board tabs in which the gold is bonded to a partially visible metallic underplating, said underplating being bonded to a nonmetallic substrate, said method being adapted for use with a self-contained, portable gold recovery unit having a closable processing chamber, a tank for holding an etching solution, a first means for selectively delivering the etching solution to and from the processing chamber, a second means for selectively delivering a rinsing fluid to and from the processing chamber, and filtering means for filtering said etching solution or rinsing fluid as said fluids are delivered from the processing chamber, said method comprising the steps of:

(a) placing the printed circuit board tabs from which the gold is to be removed in said processing chamber;

(b) filling said holding tank with the etching solution, said etching solution comprising:
   an acid that will dissolve said metallic underplating but not the gold bonded thereto, and,
   at least one effervescent compound, said effervescent compound being selected to create a vigorous frothing action that will help the gold flake away from the substrate as the metallic underplating is dissolved, (c) delivering said etching solution to said processing chamber and allowing it to come in contact with the partially visible metallic underplating, whereby a tunneling action begins in which the underplating is dissolved or tunneled out from under the gold, thereby allowing the gold with the help of the frothing action created by said effervescent compound to flake away from said substrate;

(d) removing the etching solution from said processing chamber, and retaining any gold flakes suspended in the etching solution in said filtering means;

(e) rinsing the processing chamber and the nonmetallic substrate contained therein with said rinsing fluid, thereby flushing any remaining gold flakes to said filtering means, and (f) removing said gold flakes from said filtering means.

* * * * *